US007948316B2

(12) United States Patent
Wu et al.

(10) Patent No.: US 7,948,316 B2
(45) Date of Patent: May 24, 2011

(54) LOW BIAS CURRENT AMPLIFIER

(75) Inventors: Wei-Chung Wu, Richardson, TX (US); Lin Chen, San Jose, CA (US); Yuan Gu, Dallas, TX (US); Kae Ann Wong, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 12/473,978

(22) Filed: May 28, 2009

(65) Prior Publication Data

US 2009/0295484 A1 Dec. 3, 2009

Related U.S. Application Data

(60) Provisional application No. 61/057,844, filed on May 31, 2008.

(51) Int. Cl.
*H03F 3/26* (2006.01)

(52) U.S. Cl. ........................................ 330/267; 330/277

(58) Field of Classification Search .................. 330/277, 330/255, 262–265, 267
See application file for complete search history.

(56) References Cited

U.S. PATENT DOCUMENTS 4,335,358 A * 6/1982 Hoeft ............................ 330/255

* cited by examiner

*Primary Examiner* — Hieu P Nguyen
(74) *Attorney, Agent, or Firm* — John J. Patti; Wade J. Brady, III; Frederick J. Telecky, Jr.

(57) ABSTRACT

An amplifier is provided that includes an output portion that sources and sinks current associated with an output load and an amplification portion that is biased by a relatively small bias current with respect to an output current of the amplifier. The amplification portion provides an amplified output signal to the output portion. The amplifier further comprises at least one impedance component coupled between the output portion and the amplification portion to alter at least one pole associated with the amplifier to mitigate instability of the amplifier related to the relatively small bias current.

18 Claims, 3 Drawing Sheets

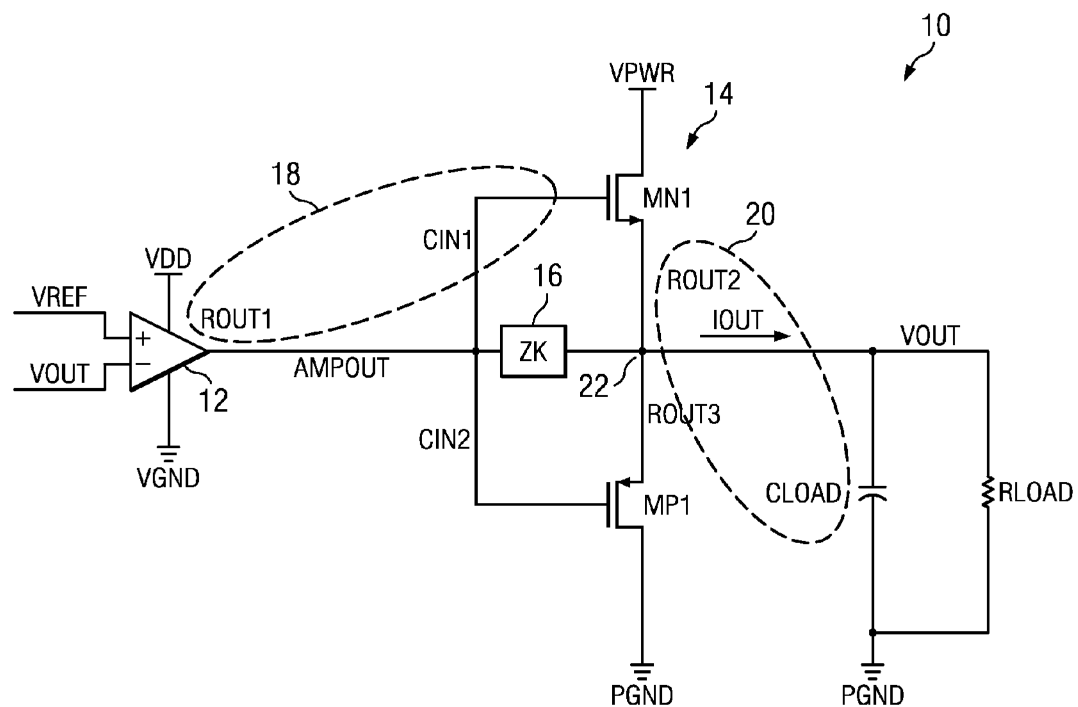
*FIG. 1*
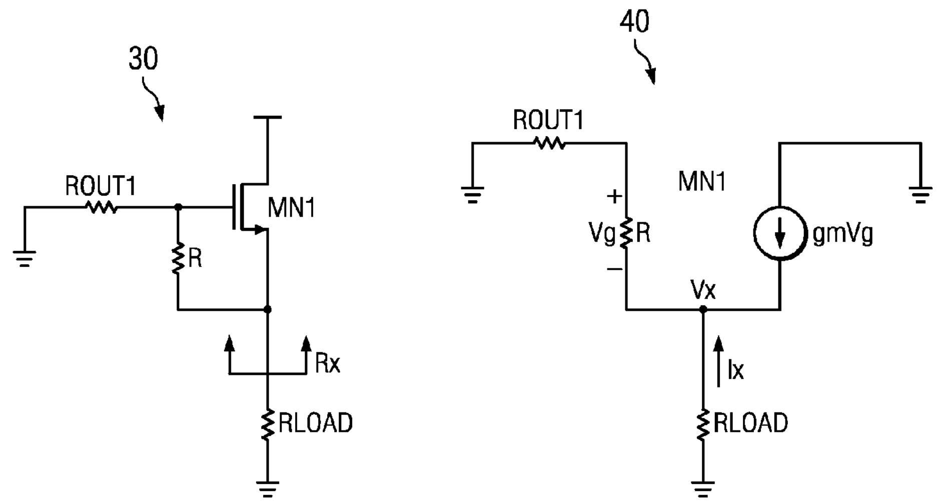
*FIG. 2*
*FIG. 3*

LOW BIAS CURRENT AMPLIFIER

RELATED APPLICATIONS

The present invention claims priority from U.S. Provisional Patent Application No. 61/057,844, filed May 31, 2008.

TECHNICAL FIELD

This invention relates to circuits, and more specifically to a low bias current amplifier.

BACKGROUND

A power efficiency improvement of a Class A type amplifier is amplifier circuit design with two transistors in its output stage in a source follower type amplifier configuration. Source follower operation typically uses two "complementary" transistors, one an NPN-type and the other a PNP-type with both power transistors receiving the same input signal together that is equal in magnitude and phase to each other. In this configuration, the output current handling capability is significantly increased. The input signal is reproduced at the output, except at the midpoint when both transistors are OFF and at either rail. These amplifiers are more commonly known as Class B type amplifiers due to the "dead zone" in the midpoint. At very low biasing currents, Class B type amplifiers can oscillate and become unstable under high load conditions.

SUMMARY

In accordance with an aspect of the invention, an amplifier is provided that comprises an output portion that sources and sinks current associated with an output load and an amplification portion that is biased by a relatively small bias current with respect to an output current of the amplifier. The amplification portion provides an amplified output signal to the output portion. The amplifier further comprises at least one impedance component coupled between the output portion and the amplification portion to alter at least one pole associated with the amplifier to mitigate instability of the amplifier related to the relatively small bias current.

In accordance with another aspect of the present invention, a Class B amplifier is provided that comprises an output portion that includes an N-type metal oxide field effect transistor (MOSFET) (NMOS) that sources current and P-type MOSFET (PMOS) that sinks current associated with an output load and an amplification portion that is biased by a relatively small bias current with respect to an output current of the amplifier, such that the ratio of the bias current of the amplification portion to an output current of the amplifier is about 1:20 to about 1:10,000. The amplification portion provides an amplified output signal to the gates of the NMOS and the PMOS. The Class B amplifier further comprises at least one impedance component coupled between the gates of the NMOS and the PMOS and the amplification portion to alter at least one pole associated with the amplifier to mitigate instability of the amplifier related to the relatively small bias current.

In accordance with yet another aspect of the invention, a Class B amplifier is provided that comprises means for sourcing and sinking current associated with an output load and means for providing an amplified output signal to the means for sourcing and sinking current. The Class B amplifier further comprises means for biasing the means for providing an amplified output signal with a bias current that is a relatively small with respect to an output current of the amplifier and means for altering at least one pole associated with the amplifier to mitigate instability of the amplifier related to the relatively small bias current.

BRIEF DESCRIPTION OF THE DRAWINGS

FIG. 1 illustrates a block diagram of a low bias current Class B amplifier in accordance with an aspect of the present invention.

FIG. 2 illustrates a resistor model that can be employed to determine an increase in impedance of an output pole of the amplifier in accordance with an aspect of the present invention.

FIG. 3 illustrates an equival small-signal model that can be employed to determine an increase in impedance of the output pole of the amplifier in accordance with an aspect of the present invention.

DETAILED DESCRIPTION

Figure 4:
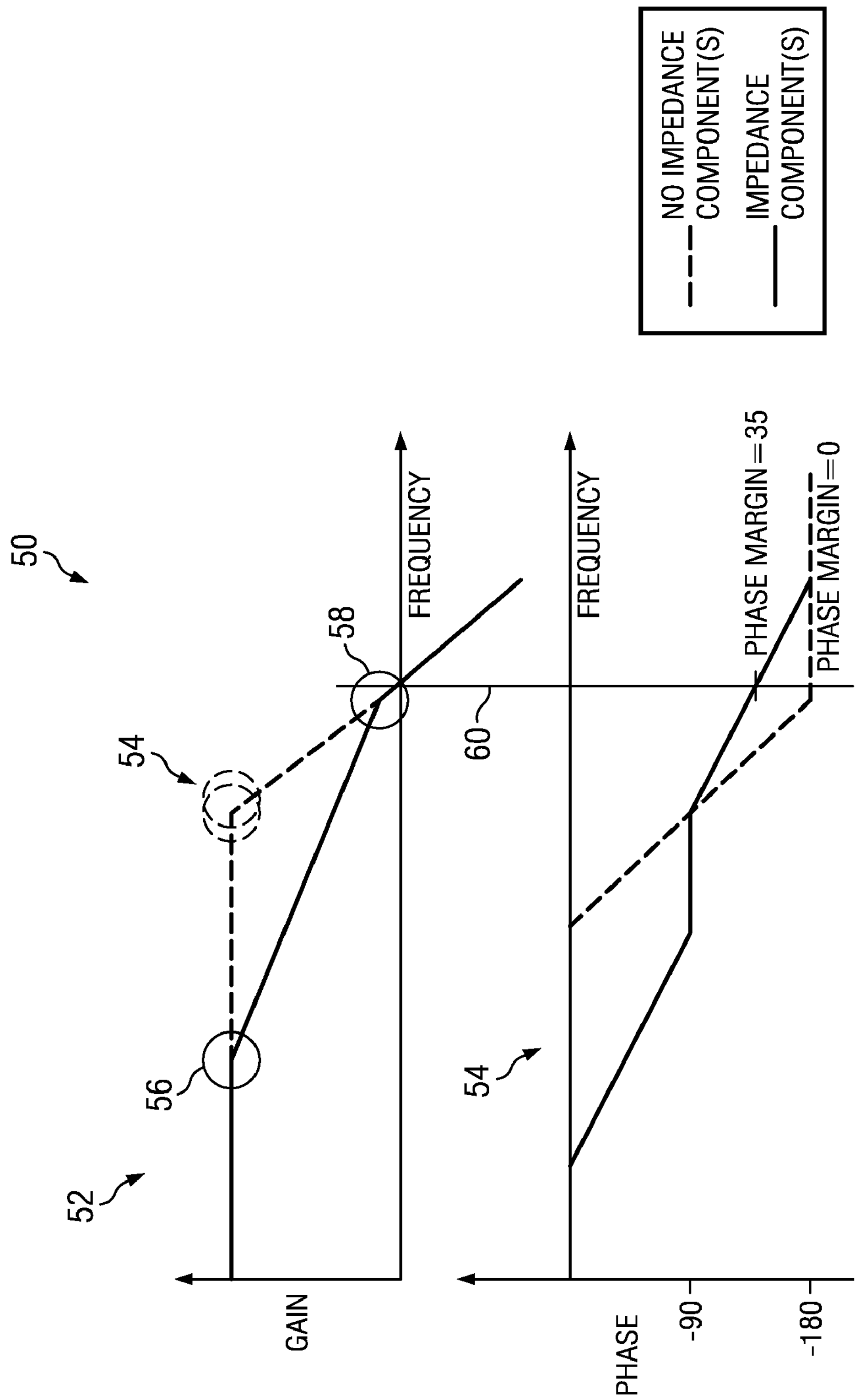
FIG. 4 illustrates a bode plot that illustrates gain responses and phase responses of the amplifier of FIG. 1 with and without the one or more impedance components in accordance with an aspect of the present invention.

FIG. 1 illustrates a block diagram of a Class B amplifier 10 in accordance with an aspect of the present invention. The amplifier 10 includes an amplification portion 12 and an output portion 14. The output portion 14 includes an N-type metal oxide semiconductor field effect transistor (MOSFET) MN1 (hereinafter referred to as an NMOS) coupled to a power supply voltage (VPWR) and an output node 22. The output portion 14 includes a P-type MOSFET MP1 (hereinafter referred to as a PMOS) coupled to a power supply ground (VGND) and the output node 22. The output portion 14 is configured to source current through the NMOS MN1 during a push phase and sink current through the PMOS MP1 during a sink phase. The output node 22 is coupled to an output capacitor CLOAD and an output load RLOAD. The amplification portion 12 is powered by a supply voltage (VDD) and a supply ground (VGND). The amplification portion 12 receives a reference signal VREF and an output signal VOUT from the output node 22 and provides an amplified output signal (AMPOUT) to a gate of the NMOS MN1 and to a gate of the PMOS MP1.

In accordance with an aspect of the present invention, the amplification portion 12 is biased at a relatively low bias current with respect to the amount of output current IOUT provided at the output of the amplifier 10. For example, an output current can be provided that is about 20 times to about 10,000 times the bias current of the amplification portion 12. However, at heavy load conditions an input pole 18 formed from an output resistance (ROUT1) of the amplification portion 12 and an input capacitance (CIN1 and CIN2) of the NMOS MN1 and PMOS MP1 moves toward an output pole 20 formed from an output resistance (ROUT2) of the NMOS MN1 and the output capacitor CLOAD during the source phase. It is to be appreciated that the input pole 18 also moves toward an output pole formed from an output resistance (ROUT3) of the PMOS and the output capacitor CLOAD during the sink phase.

In either situation, if the output impedance of the amplification portion 12 is not small enough, the amplifier 10 becomes unstable. In order to push the input pole to a higher frequency, the amplification portion 12 could consume more current by increasing the bias current of the amplification portion 12 to lower the output impedance and consequently the gain. However, in accordance with an aspect of the present invention, one or more impedance components 16 are coupled between the output of the amplification portion 12 plus the gates of the NMOS MN1 and PMOS MP1 of the input portion 14 to push the input pole to a higher frequency and the output pole to a lower frequency without consuming more bias current at the amplification portion 12. The one or more impedance components 12 can be a diode, a transistor, an inductor, a resistor or combination thereof. The addition of one or more impedance components 16 effectively splits and moves the input pole 18 away from the output pole 20. With the one or more impedance components 16, the output of the amplification portion 12 sees another current path to the source of MN1 or MP1 so that the impedance at its output is reduced. Therefore, the input pole is moved to a higher frequency without increasing the bias current in the amplification portion 12. While the input pole 18 is moved to higher frequency, the output pole 20 is pushed to a lower frequency because of the increased impedance looking into the source of MN1 or MP1 and hence splitting the poles.

The increase in impedance, which causes a decrease in frequency, for the output pole 20 can be derived by applying a resistor model 30 of FIG. 2 and a small-signal model 40 of FIG. 3 looking into the source of the NMOS MN1 and utilizing the equations below. A similar analysis can be employed to determine the decrease in impedance of the input pole 18.

$$Vg = -Vx\frac{R}{ROUT1 + R} \quad \text{Equation 1}$$

$$-Ix - gmVg + Vx\frac{1}{R + ROUT1} = 0$$

$$Ix = gmVx\frac{R}{R + ROUT1} + Vx\frac{1}{R + ROUT1} \quad \text{Equation 2}$$

$$\frac{Vx}{Ix} = \frac{1}{gm\frac{R}{R + ROUT_1} + \frac{1}{R + ROUT_1}} = \frac{R + ROUT1}{1 + gmR} \quad \text{Equation 3}$$

$$Rx = \frac{1}{gm} + \frac{ROUT1}{gmR} = \frac{1}{gm} + \frac{ROUT1}{\beta} \quad \text{Equation 4}$$

where $R_L$ is the output load, $R_S$ is output impedance of the amplification portion 12, R is the resistance of the one or more impedance components 16 and $R_X$ is the output impedance associated with the output pole 20. An analogy to bipolar transistor characteristics can be employed such that:

$$Ib = \frac{Vg}{R} \quad \text{Equation 5}$$

$$Ic = gmVg \quad \text{Equation 6}$$

$$\frac{Ic}{Ib} = gmR = \beta \quad \text{Equation 7}$$

This results in $$Rx = \frac{1}{gm} + \frac{Rout1}{gmR} = \frac{1}{gm} + \frac{ROUT1}{\beta} \quad \text{Equation 8}$$

FIG. 4 illustrates a bode plot 50 that illustrates gain responses and phase responses of the amplifier 10 of FIG. 1 with and without the one or more impedance components 16 in accordance with an aspect of the present invention. A gain versus frequency graph 52 is disposed above a phase versus frequency graph 54 such that the frequencies are aligned between the graphs. The dashed lines indicate the responses associated with the amplifier 10 without one or more impedance components coupled between the amplification portion 12 and the output portion 14 of the amplifier 10. The solid lines indicate the responses associated with the amplifier 10 with one or more impedance components 16 coupled between the amplification portion 12 and the output portion 14 of the amplifier 10. The general rule for stability is that the phase shift of the output should not reach 180° phase rolloff before the gain of the amplifier has reached zero gain due to gain rolloff caused by the poles of the amplifier.

As illustrated by the dashed line in the gain graph, the input pole and the output poles overlap such that a double overlapping pole 54 is a result. The doubling of the poles causes an increase in the slope of the phase rolloff since each pole causes a 902 shift in the phase of the output signal. For example, a gain rolloff of −20 db/decade causes a phase rolloff of 45°/decade that starts at a decade in frequency prior to a pole and ends a decade in frequency after the pole. Therefore, the phase will rolloff −40 db/decase for the double overlapping pole 54. As a result of the double overlapping pole 54, the phase has rolled off to −180° before the gain of the amplifier has reached zero. This is unacceptable since it will cause the amplifier to oscillate and become unstable. As illustrated by the solid line in the gain graph, the input pole 58 and the output pole 56 have been pushed apart from one another. This causes two spaced apart sloping portions that have less steep slope (i.e., −20 db/decade) during the first rolloff. As a result, the phase has rolled off to −155° when the gain of the amplifier has reached zero. This provides a phase margin of 35° that assures stability of the amplifier during normal operation.

Figure 5:
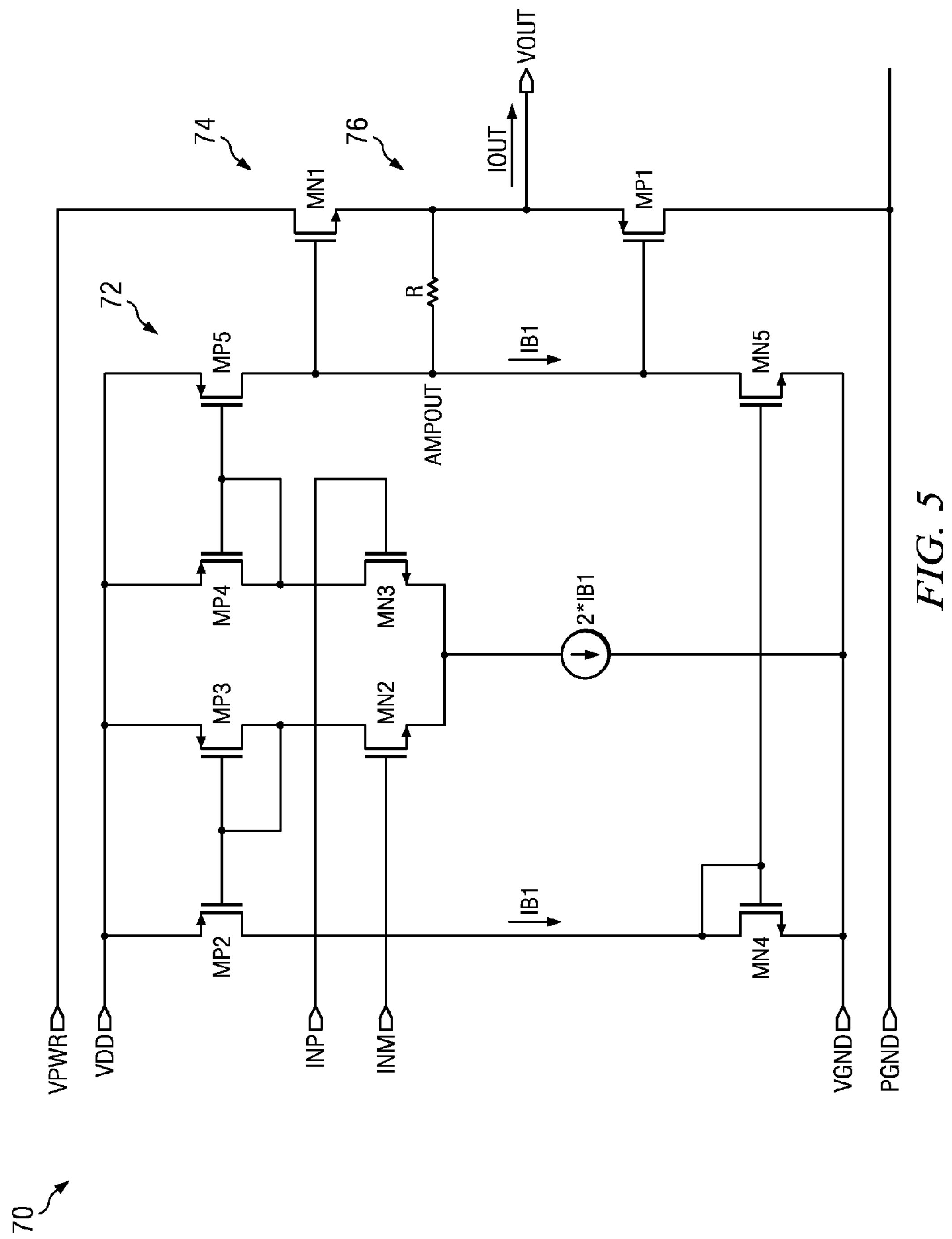
FIG. 5 illustrates a detailed schematic diagram of a low bias current Class B amplifier in accordance with an aspect of the present invention.

FIG. 5 illustrates a detailed schematic diagram of a Class B amplifier 70 in accordance with an aspect of the present invention. The amplifier 70 includes an amplification portion 72 and an output portion 74. The output portion 74 includes an NMOS MN1 coupled to a power supply voltage (VPWR) and an output node 76. The output portion 74 includes a PMOS MP1 coupled to a power supply ground (PGND) and the output node 76. The output portion 74 is configured to source current through the NMOS MN1 during a source phase and sink current through the PMOS MP1 during a sink phase. The amplification portion 72 is powered by a supply voltage (VDD) and a supply ground (VGND). The amplification portion 72 receives a first input signal INP to a gate of a first input NMOS MN3 and a second input signal INM to a gate of a second input NMOS MN2. A current source sinks a current 2*IB1. When the inputs (INP and INM) are equal, then half of the current flows through MN2 and half flows through MN3. Each of these currents is equal to IB1. This current is then mirrored through two sets of current mirrors: MP3 with MP2 and MP4 with MP5. The bias current IB1 is mirrored through a current mirror formed of NMOS MN4 and NMOS MN5. An amplified output signal AMPOUT is provided to a gate of the NMOS MN1 and the gate of the PMOS MP1. This amplifier provides a push-pull output and is also known as a transconductance amplifier.

The bias current IB1 is selected to be relatively low in respect to the amount of output current IOUT provided at the output of the amplifier 70. For example, a bias current of 3 microamps can provide an output current of 3 ma. In one aspect of the invention, an output current IOUT can be provided that is about 20 times to about 10,000 times the bias current IB1 of the amplification portion 72. A resistor R is coupled between the output of the amplification portion 72 and the gates of the NMOS MN1 and PMOS MP1 of the output portion 74 to push the input pole to a higher frequency and the output pole to a lower frequency as previously discussed without consuming more bias current at the amplification portion 72. The size of the resistor R can be selected based on a given bias current to output current ratio. For example, a 1 MOhm resistor can be used for a 1:1000 bias current to output current ratio, while a 100 MOhm resistor can be used for a 1:10,000 bias current to output current ratio.

It is to be appreciated that although the above examples of the present invention are illustrated with amplifiers, the present invention can be employed with other circuits that have a substantially identical poles in which one is associated with a low bias current and the other is associated with a second bias current linked together through a source follower configuration.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An amplifier comprising:

an output portion that sources and sinks current associated with an output load, wherein the output portion includes a metal oxide field effect transistor (MOSFET);

an amplification portion that is biased by a relatively small bias current with respect to an output current of the amplifier, wherein the amplification portion provides an amplified output signal to the output portion, and wherein an inner pole is formed from an output resistance of the amplification portion and an input capacitance of the MOSFET, and wherein an outer pole is formed from an output resistance of the MOSFET and an output capacitor coupled to an output of the amplifier; and an impedance component coupled between the output portion and the amplification portion to alter a pole associated with the amplifier to mitigate instability of the amplifier related to the relatively small bias current.

2. The amplifier of claim 1, wherein the impedance component comprises at least one of a diode, a transistor, an inductor and a resistor or any combination thereof.

3. The amplifier of claim 1, wherein the impedance component increases the impedance of the outer pole resulting in a shift of the outer pole to a lower frequency and decreases the impedance of the inner pole resulting in a shift of the inner pole to a higher frequency.

4. The amplifier of claim 3, wherein the MOSFET comprises a source MOSFET that forms an inner and outer pole during a sourcing phase and a sink MOSFET that forms an inner and outer pole during a sinking phase, and the impedance component being coupled to gates of the sourcing and sinking MOSFETS to alter the respective inner and outer poles during the respective sourcing and sinking phases.

5. The amplifier of claim 4, wherein the amplification portion comprises first and second input MOSFETS coupled to a current source that is twice the value of the relatively low bias current, the bias current being mirrored from the first and second input MOSFETS to one or more additional MOSFETS.

6. The amplifier of claim 1, wherein the ratio of the bias current of the amplification portion to an output current of the amplifier is about 1:20 to about 1:10,000.

7. The amplifier of claim 1, wherein the amplifier is a Class B amplifier.

8. The amplifier of claim 1, wherein the impedance component is a resistor that is selected to have a value that is increased proportionally to the ratio between the bias current and the output current of the amplifier.

9. A class B amplifier comprising:

an output portion that includes an N-type MOSFET (NMOS) that sources current and P-type MOSFET (PMOS) that sinks current associated with an output load;

an amplification portion that is biased by a relatively small bias current with respect to an output current of the amplifier, such that the ratio of the bias current of the amplification portion to an output current of the amplifier is about 1:20 to about 1:10,000, wherein the amplification portion provides an amplified output signal to the gates of the NMOS and the PMOS; and an impedance component coupled between the gates of the NMOS and the PMOS and the amplification portion to alter a pole associated with the amplifier to mitigate instability of the amplifier related to the relatively small bias current.

10. The amplifier of claim 9, wherein the impedance component comprises at least one of a diode, a transistor, an inductor and a resistor.

11. The amplifier of claim 9, wherein an inner pole is formed from an output resistance of the amplification portion and an input capacitance of the NMOS and/or PMOS and an outer pole is formed from an output resistance of the NMOS and an output capacitor coupled to an output of the amplifier during a sourcing mode, and an inner pole is formed from an output resistance of the amplification portion and an input capacitance of the PMOS and/or NMOS and an outer pole is formed from an output resistance of the PMOS and the output capacitor during a sinking mode.

12. The amplifier of claim 11, wherein the impedance component increases the impedance of the outer poles resulting in a shift of the outer poles to a lower frequency and decreases the impedance of the inner poles resulting in a shift of the inner poles to a higher frequency.

13. The amplifier of claim 11, wherein the amplification portion comprises first and second input MOSFETS coupled to a current source that is twice the value of the relatively low bias current, the bias current being mirrored from the first and second input MOSFETS to one or more additional MOSFETS.

14. The amplifier of claim 9, wherein the impedance component is a resistor that is selected to have a value that is increased proportionally to the ratio between the bias current and the output current of the amplifier.

15. A class B amplifier comprising:

means for sourcing and sinking current associated with an output load;

means for providing an amplified output signal to the means for sourcing and sinking current;

means for biasing the means for providing an amplified output signal based with a bias current that is a relatively small with respect to an output current of the amplifier, wherein the ratio of the bias current of means for amplifying to an output current of the amplifier is about 1:20 to about 1:10,000; and means for altering a pole associated with the amplifier to mitigate instability of the amplifier related to the relatively small bias current.

16. The amplifier of claim 15, wherein the pole comprises a first pole associated with an output resistance of the means for amplifying and an input capacitance associated with the means for sourcing and sinking and a second pole associated with an output resistance of the means for sourcing and sinking and an output capacitor coupled to an output of the amplifier.

17. The amplifier of claim 16, wherein the means for altering increases the impedance of the second pole resulting in a shift of the second pole to a lower frequency and decreases the impedance of the first pole resulting in a shift of the first pole to a higher frequency.

18. The amplifier of claim 16, wherein the first and second poles are associated with sourcing current and further comprising a third pole associated with an output resistance of the means for sourcing and sinking and the output capacitor associated with the output load current associated with sinking current.

* * * * *